US008048805B2

(12) United States Patent
Chan et al.

(10) Patent No.: US 8,048,805 B2
(45) Date of Patent: *Nov. 1, 2011

(54) METHODS FOR GROWING LOW-RESISTIVITY TUNGSTEN FILM

(75) Inventors: Lana Hiului Chan, Northborough, MA (US); Panya Wongsenakhum, San Francisco, CA (US); Joshua Collins, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/538,770

(22) Filed: Aug. 10, 2009

(65) Prior Publication Data

US 2010/0035427 A1 Feb. 11, 2010

Related U.S. Application Data

(63) Continuation of application No. 11/265,531, filed on Nov. 1, 2005, now Pat. No. 7,589,017, which is a continuation-in-part of application No. 10/815,560, filed on Mar. 31, 2004, now Pat. No. 7,262,125, which is a continuation-in-part of application No. 10/649,351, filed on Aug. 26, 2003, now Pat. No. 7,141,494, which is a continuation-in-part of application No. 09/975,074, filed on Oct. 9, 2001, now Pat. No. 6,635,965, said application No. 10/815,560 is a continuation-in-part of application No. 10/690,492, filed on Oct. 20, 2003, now Pat. No. 7,005,372.

(60) Provisional application No. 60/292,917, filed on May 22, 2001, provisional application No. 60/441,834, filed on Jan. 21, 2003.

(51) Int. Cl.
 *H01L 21/44* (2006.01)

(52) U.S. Cl. ........ 438/685; 438/618; 438/648; 438/679; 438/680; 438/681; 257/E21.17

(58) Field of Classification Search .................. 438/618, 438/648, 679–681, 685; 257/E21.17
See application file for complete search history.

(56) References Cited

U.S. PATENT DOCUMENTS

| 4,746,375 A | 5/1988 | Iacovangelo |
| 4,804,560 A | 2/1989 | Shioya et al. |

(Continued)

FOREIGN PATENT DOCUMENTS

WO WO01/27347 4/2001

OTHER PUBLICATIONS

U.S. Final Office Action mailed Jan. 13, 2010 from U.S. Appl. No. 12/030,645.

(Continued)

*Primary Examiner* — Michelle Estrada
(74) *Attorney, Agent, or Firm* — Weaver Austin Villeneuve & Sampson LLP

(57) ABSTRACT

Improved methods for depositing low resistivity tungsten films are provided. The methods involve depositing a tungsten nucleation layer on a substrate and then depositing a tungsten bulk layer over the tungsten nucleation layer to form the tungsten film. The methods provide precise control of the nucleation layer thickness and improved step coverage. According to various embodiments, the methods involve controlling thickness and/or improving step coverage by exposing the substrate to pulse nucleation layer (PNL) cycles at low temperature. Also in some embodiments, the methods may improve resistivity by using a high temperature PNL cycle of a boron-containing species and a tungsten-containing precursor to finish forming the tungsten nucleation layer.

18 Claims, 7 Drawing Sheets

U.S. PATENT DOCUMENTS

| | | | |
|---|---|---|---|
| 5,028,565 | A | 7/1991 | Chang et al. |
| 5,227,329 | A | 7/1993 | Kobayashi et al. |
| 5,250,329 | A | 10/1993 | Miracky et al. |
| 5,326,723 | A | 7/1994 | Petro et al. |
| 5,391,394 | A | 2/1995 | Hansen |
| 5,661,080 | A | 8/1997 | Hwang et al. |
| 5,726,096 | A | 3/1998 | Jung |
| 5,795,824 | A | 8/1998 | Hancock |
| 5,804,249 | A | 9/1998 | Sukharev et al. |
| 5,817,576 | A | 10/1998 | Tseng et al. |
| 5,926,720 | A | 7/1999 | Zhao et al. |
| 5,956,609 | A | 9/1999 | Lee et al. |
| 6,001,729 | A | 12/1999 | Shinriki et al. |
| 6,017,818 | A | 1/2000 | Lu |
| 6,037,263 | A | 3/2000 | Chang |
| 6,066,366 | A | 5/2000 | Berenbaum et al. |
| 6,099,904 | A | 8/2000 | Mak et al. |
| 6,107,200 | A | 8/2000 | Takagi et al. |
| 6,143,082 | A | 11/2000 | McInerney et al. |
| 6,174,812 | B1 | 1/2001 | Hsiung et al. |
| 6,206,967 | B1 | 3/2001 | Mak et al. |
| 6,245,654 | B1 | 6/2001 | Shih et al. |
| 6,265,312 | B1 | 7/2001 | Sidhwa et al. |
| 6,277,744 | B1 | 8/2001 | Yuan et al. |
| 6,294,468 | B1 | 9/2001 | Gould-Choquette et al. |
| 6,297,152 | B1 | 10/2001 | Itoh et al. |
| 6,309,966 | B1 | 10/2001 | Govindarajan et al. |
| 6,355,558 | B1 | 3/2002 | Dixit et al. |
| 6,404,054 | B1 | 6/2002 | Oh et al. |
| 6,551,929 | B1 | 4/2003 | Kori et al. |
| 6,566,250 | B1 | 5/2003 | Tu et al. |
| 6,566,262 | B1 | 5/2003 | Rissman et al. |
| 6,607,976 | B2 | 8/2003 | Chen et al. |
| 6,635,965 | B1 | 10/2003 | Lee et al. |
| 6,706,625 | B1 | 3/2004 | Sudijono et al. |
| 6,720,261 | B1 | 4/2004 | Anderson et al. |
| 6,740,585 | B2 | 5/2004 | Yoon et al. |
| 6,797,340 | B2 | 9/2004 | Fang et al. |
| 6,844,258 | B1 | 1/2005 | Fair et al. |
| 6,861,356 | B2 | 3/2005 | Matsuse et al. |
| 6,902,763 | B1 | 6/2005 | Elers et al. |
| 6,936,538 | B2 | 8/2005 | Byun |
| 6,939,804 | B2 | 9/2005 | Lai et al. |
| 6,962,873 | B1 | 11/2005 | Park |
| 7,005,372 | B2 | 2/2006 | Levy et al. |
| 7,141,494 | B2 | 11/2006 | Lee et al. |
| 7,157,798 | B1 | 1/2007 | Fair et al. |
| 7,211,144 | B2 | 5/2007 | Lu et al. |
| 7,262,125 | B2 | 8/2007 | Wongsenakhum et al. |
| 7,429,402 | B2 | 9/2008 | Gandikota et al. |
| 7,589,017 | B2 | 9/2009 | Chan et al. |
| 7,655,567 | B1 | 2/2010 | Gao et al. |
| 7,691,749 | B2 | 4/2010 | Levy et al. |
| 7,754,604 | B2 | 7/2010 | Wongsenakhum et al. |
| 7,772,114 | B2 | 8/2010 | Chan et al. |
| 2001/0008808 | A1 | 7/2001 | Gonzalez |
| 2001/0014533 | A1 | 8/2001 | Sun |
| 2001/0015494 | A1 | 8/2001 | Ahn |
| 2001/0044041 | A1 | 11/2001 | Badding et al. |
| 2002/0090796 | A1 | 7/2002 | Desai et al. |
| 2002/0177316 | A1 | 11/2002 | Miller et al. |
| 2003/0059980 | A1 | 3/2003 | Chen et al. |
| 2003/0104126 | A1 | 6/2003 | Fang et al. |
| 2003/0127043 | A1 | 7/2003 | Lu et al. |
| 2004/0014315 | A1 | 1/2004 | Lai et al. |
| 2004/0044127 | A1 | 3/2004 | Okubo et al. |
| 2004/0202786 | A1 | 10/2004 | Wongsenakhum et al. |
| 2004/0206267 | A1 | 10/2004 | Sambasivan et al. |
| 2005/0031786 | A1 | 2/2005 | Lee et al. |
| 2005/0136594 | A1 | 6/2005 | Kim |
| 2006/0094238 | A1 | 5/2006 | Levy et al. |
| 2008/0124926 | A1 | 5/2008 | Chan et al. |
| 2009/0149022 | A1 | 6/2009 | Chan et al. |

OTHER PUBLICATIONS

Gao et al., "Method for Improving Adhesion of Low Resistivity Tungsten/Tungsten Nitride Layers," Novellus Systems, Inc., U.S. Appl. No. 12/556,490, filed Sep. 9, 2009.

Gao et al., "Methods for Improving Uniformity and Resistivity of Thin Tungsten Films," Novellus Systems, Inc, filed Dec. 11, 2009, U.S. Appl. No. 12/636,616.

U.S. Office Action mailed Jan. 26, 2010 from U.S. Appl. No. 11/951,236.

U.S. Notice of Allowance mailed Mar. 2, 2010 from U.S. Appl. No. 11/349,035.

Allowed Claims from U.S. Appl. No. 11/349,035, Mar. 2, 2010.

Danck, et al, "Tungsten Barrier And Seed for Copper Filled TSV," Novellus Systems, Inc., filed Mar. 12, 2010, U.S. Appl. No. 12/723,532.

Chandrashekar, et al., "Method for Forming Tungsten Contacts and Interconnects with Small Critical Dimensions," Novellus Systems, Inc, filed Apr. 6, 2010, U.S. Appl. No. 12/755,248.

Chen, et al., "Methods for Depositing Ultra Thin Low Resistivity Tungsten Film for Small Critical Dimension Contacts and Interconnects," Novellus Systems, Inc, filed Apr. 6, 2010, U.S. Appl. No. 12/755,259.

U.S. Notice of Allowance and Allowed Claims mailed Apr. 6, 2010 from U.S. Appl. No. 11/951,236.

U.S. Office Action mailed May 3, 2010 from U.S. Appl. No. 12/407,541.

U.S. Final Office Action mailed May 7, 2010 from U.S. Appl. No. 12/202,126.

Chan et al., "Method for Improving Uniformity and Adhesion of Low Resistivity Tungsten Film," Novellus Systems, Inc., U.S. Appl. No. 12/829,119, filed Jul. 1, 2010.

U.S. Office Action mailed Jun. 11, 2010 from U.S. Appl. No. 11/963,698.

U.S. Final Office Action mailed Jul. 23, 2010 from U.S. Appl. No. 12/030,645.

U.S. Office Action mailed Jul. 26, 2010 from U.S. Appl. No. 12/202,126.

International Search Report and Written Opinion mailed Apr. 12, 2010 from U.S. Appl. No. PCT/US2009/055349.

Hoover, Cynthia, "Enabling Materials for Contact Metallization," Praxair Electronic Materials R&D, Jul. 2007, pp. 1-16.

Purchase of ethylcyclopentadienyl)dicarbonylnitrosyltungsten from Praxair in Oct. 2006.

U.S. Final Office Action mailed Oct. 19, 2010 from U.S. Appl. No. 12/407,541.

U.S. Final Office Action for U.S. Appl. No. 11/963,698 mailed Dec. 30, 2010.

U.S. Office Action for U.S. Appl. No. 12/636,616 mailed Jan. 25, 2011.

U.S. Final Office Action mailed Feb. 7, 2011 from U.S. Appl. No. 12/202,126.

Notice of Allowance and Fee Due mailed Jan. 24, 2011, from U.S Appl. No. 12/030,645.

Allowed Claims from U.S Appl. No. 12/030,645 as of Jan. 24, 2011.

Lee et al., PCT Search Report, Completed Oct. 15, 2004, PCT/US2004/006940, Int'l filing date May 3, 2004.

Lee et al., Written Opinion, Completed Oct. 15, 2004, PCT/US2004/006940, Int'l filing date May 3, 2004.

George et al., "Surface Chemistry for atomic Layer Growth", J. Phys. Chem, 1996, vol. 100, No. 31, pp. 13121-13131.

Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.

Klaus et al., "Atomic layer deposition of tungsten using sequential surface chemistry with a sacrificial stripping reaction", Thin Solid Films 360 (2000) 145-153.

Klaus et al., "Atomically Controlled Growth of Tungsten and Tungsten Nitride Using Sequential Surface Reactions," Applied Surface Science, 162-163, (2000) 479-491.

Li et al., "Deposition of $WN_xC_y$ Thin Films by ALCVD™ Method for Diffusion Barriers in Metallization," IITC Conference Report, 2002, 3 pages.

Elam et al, "Nucleation and Growth During Tungsten Atomic Layer Deposition on $SiO_2$ Surfaces," Thin Solid Films, 2001, 13 pages.

Collins et al., "Pulsed Deposition of Ultra Thin Tungsten for Plugfill of High Aspect Ratio Contacts," Presentation made at Semicon Korea 2003, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

U.S. Office Action mailed Jul. 12, 2005, from U.S. Appl. No. 10/815,560.

U.S. Office Action mailed Jul. 17, 2002, from U.S. Appl. No. 09/975,074.

U.S. Office Action mailed Feb. 8, 2005, from U.S. Appl. No. 10/649,351.

U.S. Office Action mailed Jul. 14, 2005, from U.S. Appl. No. 10/649,351.

Presentation by Inventor James Fair: "Chemical Vapor Deposition of Refractory Metal Silicides," 27 Pages, 1983.

Saito et al., "A Novel Copper Interconnection Technology Using Self Aligned Metal Capping Method," IEEE, 3 Pages, 2001.

U.S. Office Action mailed Jun. 22, 2004, from U.S. Appl. No. 10/435,010.

U.S. Office Action mailed Mar. 23, 2005, from U.S. Appl. No. 10/690,492.

U.S. Office Action mailed Nov. 23, 2005, from U.S. Appl. No. 10/984,126.

Levy et al., "Deposition of Tungsten Nitride", Novellus Systems, Inc., filed Dec. 16, 2005, U.S. Appl. No. 11/305,368, pp. 1-39.

U.S. Office Action mailed Dec. 28, 2005, from U.S. Appl. No. 10/815,560.

U.S. Office Action mailed Dec. 30, 2005, from U.S. Appl. No. 10/649,351.

Wongsenakhum et al., "Reducing Silicon Attack and Improving Resistivity of Tungsten Nitride Film", Novellus Systems, Inc., filed Feb. 6, 2006, U.S. Appl. No. 11/349,035, pp. 1-26.

U.S. Office Action mailed Apr. 17, 2006, from U.S. Appl. No. 10/815,560.

U.S. Office Action mailed May 17, 2006, from U.S. Appl. No. 10/984,126.

U.S. Office Action mailed Sep. 28, 2006, from U.S. Appl. No. 10/815,560.

Gao et al., "Methods for Improving Uniformity and Resistivity of Thin Tungsten Films," Novellus Systems, Inc, filed Jul. 24, 2007, U.S. Appl. No. 11/782,570, pp. 1-23.

Chan et al., "Methods for Growing Low-Resistivity Tungsten for High Aspect Ratio and Small Features," Novellus Systems, Inc., U.S. Appl. No. 12/030,645, filed Feb. 13, 2008.

Humayun et al., "Methods for Forming All Tungsten Contacts and Lines," Novellus Systems, Inc., U.S. Appl. No. 11/963,698, filed Dec. 21, 2007.

Chan et al., "Method for Improving Uniformity and Adhesion of Low Resistivity Tungsten Film," Novellus Systems, Inc., U.S. Appl. No. 11/951,236, filed Dec. 5, 2007.

Notice of Allowance and Fee Due mailed Mar. 12, 2003, from U.S. Appl. No. 09/975,074.

Allowed Claims from U.S. Appl. No. 09/975,074.

Notice of Allowance and Fee Due mailed Jul. 21, 2006, from U.S. Appl. No. 10/649,351.

Allowed Claims from U.S. Appl. No. 10/649,351.

Notice of Allowance and Fee Due mailed Oct. 7, 2004, from U.S. Appl. No. 10/435,010.

Allowed Claims from U.S. Appl. No. 10/435,010.

Notice of Allowance and Fee Due mailed Aug. 25, 2006, from U.S. Appl. No. 10/984,126.

Notice of Allowance and Fee Due mailed Sep. 14, 2005, from U.S. Appl. No. 10/690,492.

Allowed Claims from U.S. Appl. No. 10/690,492.

Notice of Allowance and Fee Due mailed Apr. 24, 2007, from U.S. Appl. No. 10/815,560.

Allowed Claims from U.S. Appl. No. 10/815,560.

U.S. Office Action mailed Jun. 27, 2008, from U.S. Appl. No. 11/305,368.

U.S. Office Action mailed Aug. 21, 2008, from U.S. Appl. No. 11/265,531.

Ashtiani et al., "Ternary Tungsten-Containing Thin Film Heater Elements," Novellus Systems, Inc., U.S. Appl. No. 61/025,237, filed Jan. 31, 2008.

Chen et al., "Method for Reducing Tungsten Roughness and Improving Reflectivity," Novellus Systems, Inc., U.S. Appl. No. 12/202,126, filed Aug. 29, 2008.

U.S. Office Action mailed Oct. 16, 2008, from U.S. Appl. No. 11/349,035.

U.S. Office Action mailed Sep. 29, 2008, from U.S. Appl. No. 11/782,570.

Ashtiani et al., "Ternary Tungsten-Containing Thin Films," Novellus Systems, Inc., U.S. Appl. No. 12/363,330, filed Jan. 30, 2009.

Chandrashekar et al., "Method for depositing thin tungsten film with low resistivity and robust micro-adhesion characteristics," Novellus Systems, Inc., U.S. Appl. No. 61/061,078, filed Jun. 12, 2008.

U.S. Final Office Action mailed Apr. 28, 2009, from U.S. Appl. No. 11/782,570.

U.S. Office Action mailed Apr. 3, 2009, from U.S. Appl. No. 11/305,368.

U.S. Final Office Action mailed Feb. 26, 2009, from U.S. Appl. No. 11/265,531.

U.S. Notice of Allowance mailed May 4, 2009 from U.S. Appl. No. 11/265,531.

Allowed Claims from U.S. Appl. No. 11/265,531.

U.S. Final Office Action mail Feb. 25, 2009, from U.S. Appl. No. 11/349,035.

U.S. Office Action mailed Jun. 11, 2009, from U.S. Appl. No. 11/963,698.

U.S. Office Action mailed Jun. 4, 2009, from U.S. Appl. No. 11/349,035.

Ken K. Lai and H. Henry Lamb, Precursors for Organometallic Chemical Vapor Deposition of Tungsten Carbide Films, 1995, Chemistry Material, pp. 2284-2292.

U.S. Office Action mailed Jun. 24, 2009 from U.S. Appl. No. 12/030,645.

U.S. Office Action mailed Aug. 5, 2009, from U.S. Appl. No. 11/951,236.

Ashtiani et al., "Ternary Tungsten-Containing Resistive Thin Films," Novellus Systems, Inc., U.S. Appl. No. 12/363,330, filed Jan. 30, 2009.

Chandrashekar et al., "Method for Depositing Thin Tungsten Film With Low Resistivity and Robust Micro-Adhesion Characteristics," Novellus Systems, Inc., U.S. Appl. No. 12/407,541, filed Mar. 19, 2009.

U.S. Office Action mailed Oct. 21, 2009 from U.S. Appl. No. 12/202,126.

U.S. Notice of Allowance mailed Nov. 17, 2009 from U.S. Appl. No. 11/305,368.

Allowed Claims from U.S. Appl. No. 11/305,368.

U.S. Final Office Action mailed Nov. 20, 2009 from U.S. Appl. No. 11/349,035.

U.S. Final Office Action mailed Dec. 9, 2009 from U.S. Appl. No. 11/963,698.

U.S. Notice of Allowance mailed Sep. 17, 2009 from U.S. Appl. No. 11/782,570.

Allowed Claims from U.S. Appl. No. 11/782,570.

METHODS FOR GROWING LOW-RESISTIVITY TUNGSTEN FILM

CROSS-REFERENCE TO RELATED APPLICATIONS

This application is a continuation of U.S. patent application Ser. No. 11/265,531, filed Nov. 1, 2005, titled, now U.S. Pat. No. 7,589,017 "Methods for Growing Low-Resistivity Tungsten Film," which is a continuation-in-part of U.S. patent application Ser. No. 10/815,560 (now U.S. Pat. No. 7,262, 125) filed Mar. 31, 2004, titled "Method of Forming Low-Resistivity Tungsten Interconnects," which in turn is a continuation-in-part of U.S. patent application Ser. No. 10/649, 351 (now U.S. Pat. No. 7,141,494) filed on Aug. 26, 2003, titled "Method for Reducing Tungsten Film Roughness and Improved Step Coverage," which is in turn a continuation-in-part of U.S. patent application Ser. No. 09/975,074 (now U.S. Pat. No. 6,635,965) filed Oct. 9, 2001, which in turn claims benefit of U.S. Provisional Patent Application No. 60/292, 917, filed May 22, 2001; and U.S. patent application Ser. No. 10/815,560 filed Mar. 31, 2004 is also a continuation-in-part of U.S. patent application Ser. No. 10/690,492 (now U.S. Pat. No. 7,005,372) filed on Oct. 20, 2003, titled "Deposition of Tungsten Nitride," which claims benefit of U.S. Provisional Patent Application No. 60/441,834, filed Jan. 21, 2003. All of these applications are incorporated herein by reference in their entireties for all purposes.

FIELD OF INVENTION

This invention relates to methods for preparing tungsten films. The invention is particularly useful for integrated circuit applications that require thin tungsten films having low electrical resistance.

BACKGROUND

The deposition of tungsten films using chemical vapor deposition (CVD) techniques is an integral part of many semiconductor fabrication processes. The tungsten films may be used to produce low resistivity electrical connections in the form of horizontal interconnects, vias between adjacent metal layers, and contacts between a first metal layer and the devices on the silicon substrate. In a conventional tungsten deposition process, the wafer is heated to the process temperature in a vacuum chamber, and then a very thin portion of tungsten film, which serves as a seed or nucleation layer, is deposited. Thereafter, the remainder of the tungsten film (the bulk layer) is deposited on the nucleation layer. Conventionally, the bulk layer is formed by the reduction of tungsten hexafluoride ($WF_6$) with hydrogen ($H_2$) on the growing tungsten layer. The bulk layer is generally deposited more rapidly than the nucleation layer, but cannot be produced easily and reliably without first forming the nucleation layer.

CVD and other deposition methods can be used to form a thin tungsten nucleation layer. In a CVD technique, the $WF_6$ and reducing gas (e.g., $SiH_4$ and/or $H_2$) are simultaneously introduced into the reaction chamber. This produces a continuous chemical reaction of mixed reactant gases that continuously forms tungsten film on the substrate surface. In a typical example, CVD nucleation layers are deposited from $WF_6$—SiH4 with an argon carrier gas. In some instances, CVD nucleation performance is enhanced by the presence of $H_2$ in carrier gas mixture. Note that the $WF_6$—$SiH_4$ reaction is much faster than the $WF_6$—$H_2$ reaction due to lower activation energy and greater reactivity. Other deposition methods such as atomic layer deposition (ALD) and pulsed nucleation layer (PNL) techniques may also be used to form nucleation layers.

Advancing technology requires that tungsten electrical connects be increasingly thin yet maintain very low resistance. Hence, it is critical that tungsten deposition process provide tungsten having very low resistivity. CVD-deposited bulk tungsten makes up most of the film, but how the CVD film grows depends on the nucleation film. Although CVD and other methods have been able to deposit nucleation layers, their ability to provide nucleation layers for the deposition of low resistivity tungsten in smaller features with high aspect ratios is limited. What are therefore needed are improved methods for forming a conformal nucleation layer that will lead to low resistivity tungsten films with good step coverage for small features.

SUMMARY OF INVENTION

The present invention addresses this need by providing improved methods for depositing low resistivity tungsten films. The methods provide precise control of the nucleation layer thickness and improved step coverage. According to various embodiments, the methods involve controlling thickness and/or improving step coverage by exposing the substrate to pulse nucleation layer cycles at low temperature. Also in some embodiments, the methods may improve bulk film resistivity by using a high temperature pulse nucleation cycle of a boron-containing species and a tungsten-containing precursor to finish forming the tungsten nucleation layer.

In one aspect of the invention, the nucleation layer is formed by exposing the substrate to successive PNL pulses of a non-boron-containing reducing agent, a tungsten-containing precursor, a boron-containing species and a tungsten-containing precursor. Depositing the tungsten film involves (a) positioning the substrate in a reaction chamber, (b) exposing the substrate to a non-boron-containing reducing agent, (c) exposing the substrate to a tungsten-containing precursor to form a portion of a tungsten nucleation layer, (d) exposing the substrate to a boron-containing species to form a boron-containing layer on the substrate, (e) contacting the boron-containing layer with a tungsten-containing precursor to form a portion of the tungsten nucleation layer and (f) depositing a bulk tungsten layer over the tungsten nucleation layer to form the tungsten film.

In some embodiments of methods following the above sequence, the nucleation layer steps (i.e. steps (b)-(e)) are repeated. In preferred embodiments, steps (b)-(e) are repeated from 2-5 times. Also, in preferred embodiments, the substrate temperature is maintained at about 350 C or less during these steps, and in particularly preferred embodiments, substrate temperature is maintained at a temperature ranging from about 275 C-350 C.

In another aspect of the invention, the nucleation layer is formed by exposing the substrate to alternating PNL pulses of a flow including both a non-boron-containing reducing agent and a boron-containing species. Depositing the tungsten film involves (a) positioning the substrate in a reaction chamber, (b) exposing the substrate to a flow comprising a non-boron-containing reducing agent and a boron-containing reducing agent, (c) contacting the boron-containing layer with a tungsten-containing precursor to form a portion of a tungsten nucleation layer, and (d) depositing a bulk tungsten layer over the tungsten nucleation layer to form the tungsten film.

In some embodiments of methods following the above sequence, steps (b) and (c) are repeated. In preferred embodiments, these steps are repeated from 2-5 times. Also, in certain embodiments, the substrate temperature is maintained at about 350 C or less during steps (b) and (c), for example at a temperature ranging from about 250 C-350 C. In some embodiments, the temperature may be higher, for example at or below about 415 C. Another aspect of the invention relates using a low temperature PNL process to form a portion of the nucleation layer and then finishing forming the nucleation layer using a high temperature PNL cycle. In some embodiments, the methods involve (a) position positioning the substrate in a reaction chamber, (b) performing multiple pulse nucleation layer cycles at a temperature at or below about 350 C to form a portion of a tungsten nucleation layer, (c) after step (b), performing a pulse nucleation layer cycle at a temperature at or greater than about 350 C to form a portion of the tungsten nucleation layer, and (d) depositing a bulk tungsten layer over the tungsten nucleation layer to form the tungsten film. In preferred embodiments there are preferably between 3 and 20 low temperature cycles, and more preferably between 3 and 6 low temperature cycles. Also in preferred embodiments, the high temperature cycle is performed 1-3 times, and preferably no more than one time.

In another aspect of the invention, the nucleation layer is formed by exposing the substrate to a PNL cycle of boron-containing species and a tungsten-containing precursor, followed by alternating PNL pulses of a non-boron containing reducing agent and tungsten-containing precursor, which is followed by another PNL cycle of a boron-containing species and a tungsten-containing precursor. Depositing the tungsten film involves (a) positioning the substrate in a reaction chamber, (b) exposing the substrate to a boron-containing species to form a boron-containing layer on the substrate, (c) contacting the boron-containing layer with a tungsten-containing precursor to form a portion of a tungsten nucleation layer, (d) exposing the substrate to a non-boron-containing reducing agent, (e) exposing substrate to a tungsten-containing precursor to form a portion of the tungsten nucleation layer, (f) repeating steps (d) and (e) as desired to form a portion of the tungsten nucleation layer, (g) after step (f), exposing the substrate to a boron-containing species to form a boron-containing layer on the substrate layer, (h) exposing the substrate to a tungsten-containing precusor to form the tungsten nucleation layer and depositing a bulk tungsten layer over the tungsten nucleation layer to form the tungsten film.

According to various embodiments of methods following the above sequence, steps (d) and (e) are repeated at least one time, and more preferably from 2-20 times. In preferred only one PNL cycle of a boron-containing species and a tungsten-containing precursor is performed prior to the alternating non-boron-containing reducing agent and tungsten precursor pulses. Likewise, in preferred embodiments, only one PNL cycle of a boron-containing species and a tungsten-containing precursor is performed subsequent to this step.

In preferred embodiments, the substrate temperature is below about 350 C for steps (b) and (c). Also in preferred embodiments, the substrate temperature is below about 350 C for steps (d) and (e). In particularly preferred embodiments, the substrate temperature ranges from about 275-350 C for these steps.

In preferred embodiments, the substrate temperature is above about 375 C for steps (g) and (h). In particularly preferred embodiments, the substrate temperature is between about 375 and 415 C for these steps.

Substrate temperature may change for successive depositions of the nucleation layer portions, or can remain constant through the formation of the nucleation layer following the methods described above.

In certain specific embodiments, all of the above methods may include purging the reaction chamber between exposures of the substrate to reactant species. Purging the reaction chamber typically involves flowing a carrier gas, such as argon, hydrogen, nitrogen and/or helium, through the reaction chamber (without flowing the reactant gas).

Various boron-containing species may be used. In many embodiments, the borane is diborane ($B_2H_6$). Any suitable tungsten-containing precursor may be used. In many embodiments, the tungsten-containing precursor is $WF_6$, $WCl_6$, $W(CO)_6$, or a combination of thereof. Any suitable non-boron-containing reducing agent may be used. In many embodiments, a silane or derivative thereof is used. In particularly improved embodiments, $SiH_4$ is used.

Once the tungsten nucleation layer is formed, a bulk tungsten layer is deposited to form the tungsten film. Typically, this bulk tungsten deposition is accomplished using a CVD process. Frequently, though not necessarily, the same tungsten-containing precursor is used for depositing the nucleation layer and the bulk layer. In preferred embodiments, the reducing agent for the CVD process is hydrogen gas.

In some embodiments, forming the nucleation layer involves exposing the substrate to additional reactants prior to step (b) of the above methods. In one preferred embodiment, the method involves exposing the substrate to a tungsten-containing precursor before exposing it to the reactant listed in step (b) of each of the methods described above. In another embodiment, the substrate is exposed to a PNL cycle of a boron-containing species and a tungsten-containing precursor before step (b).

These and other features and advantages of the invention will be described in more detail below with reference to the associated drawings.

BRIEF DESCRIPTION OF THE DRAWINGS

The following detailed description can be more fully understood when considered in conjunction with the drawings in which.

DETAILED DESCRIPTION

Introduction

Figure 1:
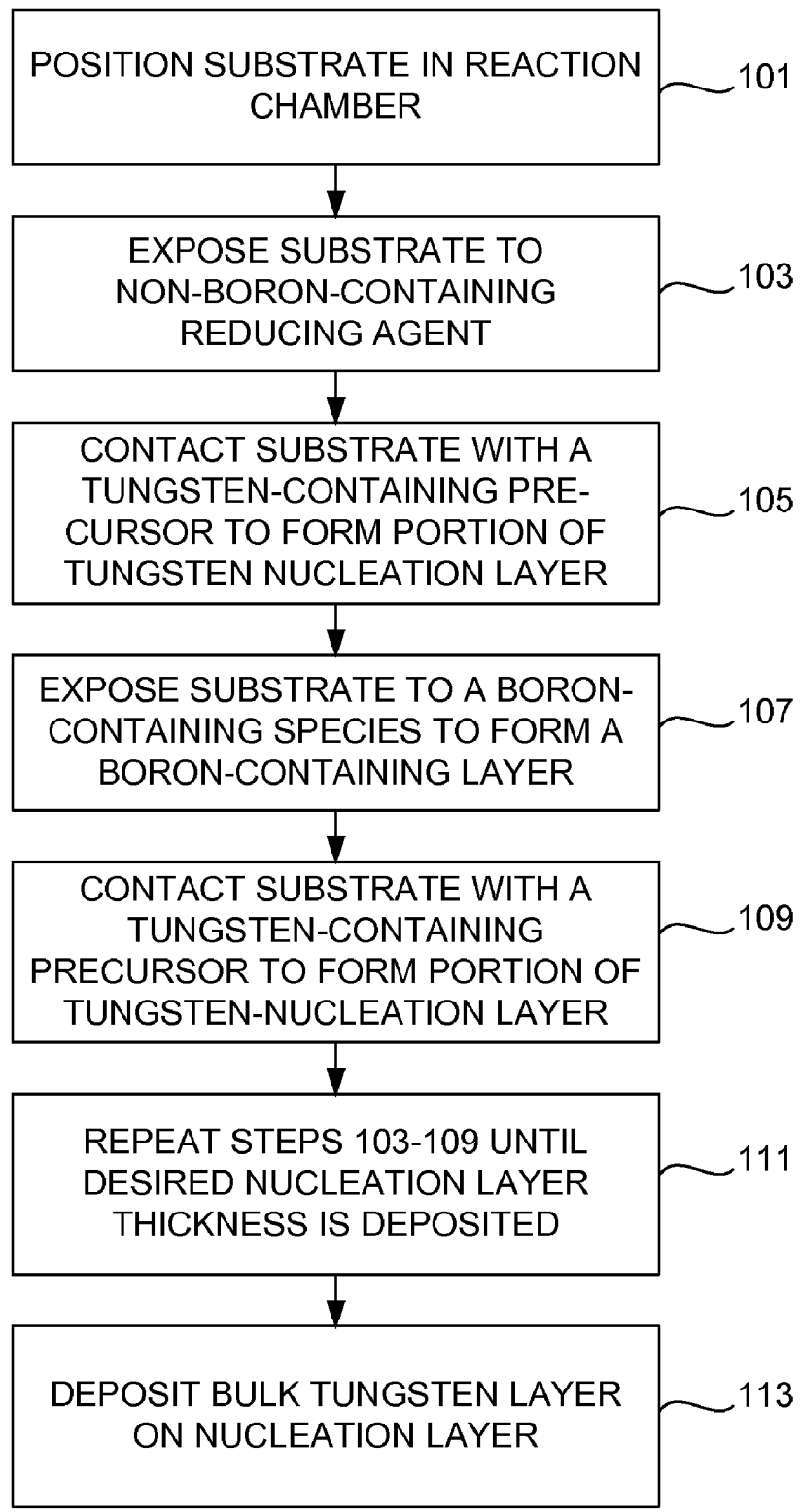
FIGS. 1-4 are process flows sheet showing relevant operations of methods according to various embodiments of the present invention.

In the following description, numerous specific details are set forth in order to provide a thorough understanding of the present invention, which pertains to forming thin tungsten films. Preferred methods involve pulsed nucleation layer (PNL) deposition techniques, which will be described in detail below. Modifications, adaptations or variations of specific methods and or structures shown and discussed herein will be apparent to those skilled in the art and are within the scope of this invention.

In a PNL technique, pulses of the reducing agent, purge gases, and tungsten-containing precursors are sequentially injected into and purged from the reaction chamber. The process is repeated in a cyclical fashion until the desired thickness is achieved. PNL is similar to atomic layer deposition techniques reported in the literature. PNL is generally distinguished from atomic layer deposition (ALD) by its higher operating pressure range (greater than 1 Torr) and its higher growth rate per cycle (greater than 1 monolayer film growth per cycle). In the context of this invention, PNL broadly embodies any cyclical process of sequentially adding reactants for reaction on a semiconductor substrate. Thus, the concept embodies techniques conventionally referred to as ALD.

The present invention involves forming a tungsten film by way of a tungsten nucleation layer. In general, a nucleation layer is a thin conformal layer which serves to facilitate the subsequent formation of a bulk material thereon. The nucleation layer may be formed using one or more PNL cycles. Additional discussion regarding PNL type processes can be found in the related U.S. patent application Ser. Nos. 10/435,010, 10/649,351 and 10/690,492, which were previously incorporated herein by reference.

While efficient tungsten deposition processes require tungsten nucleation layers, these layers typically have higher electrical resistivities than the bulk tungsten layers. Thus, to keep the electrical resistance of the overall tungsten film (tungsten nucleation layer and bulk tungsten) low, the tungsten nucleation layer should be kept as thin as possible. On the other hand, the tungsten nucleation should be sufficiently thick to fully cover the underlying substrate to support high quality bulk deposition. So, to achieve an optimal thickness, the tungsten nucleation layer may be formed in one or more PNL deposition cycles. It has been found that the tungsten nucleation layer should typically have a thickness of between about 10 and 30 Angstroms.

Generally in methods of this invention, the substrate is exposed to one or more of various sequences of a non-boron-containing reducing agent (e.g., silane) and tungsten-containing precursor, a boron-containing species (e.g., diborane) and tungsten containing precursor, and a non-boron-containing reducing agent/boron-containing species mixture and tungsten containing precursor to form the tungsten nucleation layer. These PNL steps are generally performed at low temperature, e.g., below about 450 C and in some embodiments below about 350 C, and may result in less material deposited during a cycle than in previously described tungsten nucleation layer deposition processes. In some embodiments, temperatures may be about 200 C. Because of this, for most applications of the invention, the desired thickness of the tungsten nucleation layer requires more than one PNL cycle. As will be clear from descriptions of specific embodiments below, in some embodiments, the entire PNL tungsten nucleation layer process sequence is repeated to grow the nucleation layer, while in other embodiments, only a portion of the described PNL sequence is repeated to grow most of the nucleation layer.

In one approach the substrate may be initially exposed to a tungsten-containing precursor before the operations described below. In another approach, the substrate may be initially exposed to a boron-containing species followed by exposure to a tungsten-containing precursor. Thereafter one of the methods described below may be implemented to form the tungsten nucleation layer (or remaining portion of the tungsten nucleation layer).

In some embodiments, the low temperature tungsten nucleation layer depositions described above may be followed by a higher temperature boron-containing species/tungsten-containing precursor PNL cycle. For example, a nucleation layer deposition process may include $B_2H_6/WF_6$ PNL cycle at a substrate temperature of between about 350-415 C or 375-415 C after most of the nucleation layer has been deposited by a low temperature deposition process. It has been found that this step may lower the resistivity of the deposited tungsten.

Aspects of preferred embodiments of the invention are described below in more detail.

Processes

FIG. 1 is a flow chart depicting one process flow in accordance with certain embodiments of the present invention that use a four-step low temperature PNL cycle to deposit the nucleation layer.

Initially, a substrate is provided and positioned in a reaction chamber as indicated by a process block 101. As mentioned previously, in many embodiments the substrate is a partially fabricated electronic device (e.g., a partially fabricated integrated circuit). Some specific applications of the invention will be described later.

Next, as indicated by a process block 103, the substrate is exposed to a non-boron-containing reducing agent. In preferred embodiments, this is a silane. Silane and related compounds have been found to adsorb well to metal nitride surfaces such as titanium nitride and tungsten nitride used as barrier layer materials in some integrated circuit applications. Any suitable silane or silane derivative may be used, including organic derivative of silanes. In particularly preferred embodiments, the silane is $SiH_4$. It is generally understood that silanes adsorb on the substrate surface in a self-limiting manner so as to create nominally a monolayer of silane species. Thus, the amount of adsorbed species is largely independent of the silane dosage. Substrate temperatures may be below about 350 C, for example between about 250 C and 350 C or 275 and 350 C. Chamber pressure can vary broadly, between about 1 and 400 Torr, and more preferably between about 20 and 60 Torr. Exposure time will vary depending in part upon dosages and chamber conditions. Preferably, the substrate is exposed until the surface is sufficiently and evenly covered with at least a saturated layer of silane species or other reducing agent. Note that the silane or other reducing agent may be provided alone or with a carrier gas. Examples of carrier gases include argon and argon-hydrogen mixtures.

Once the substrate is sufficiently covered with reducing agent species, the flow of reducing agent to the reaction chamber is stopped and the reaction chamber is purged with a carrier gas such as argon, hydrogen, nitrogen or helium. The gas purge clears the regions near the substrate surface of residual gas reactants that could react with fresh gas reactants for the next reaction step.

Referring back to FIG. 1, the next operation 105 involves contacting the substrate with a tungsten-containing precursor to form a portion of the tungsten nucleation layer. Any suitable tungsten-containing precursor may be used. In preferred embodiments the tungsten-containing precursor is one of $WF_6$, $WCl_6$ and $W(CO)_6$. The tungsten-containing precursor is typically provided in a dilution gas, such as argon, nitrogen, hydrogen, or a combination thereof. The substrate temperature may be below about 350 C, for example between about 250 and 350 C or 275 and 350 C. Tungsten-containing precursor dosage and substrate exposure time will vary depending upon a number factors. In general, the substrate is preferably exposed until the adsorbed silane species is sufficiently consumed by reaction with the tungsten-containing precursor to produce a portion of the tungsten nucleation layer. Thereafter, the flow of tungsten-containing precursor to the reaction chamber is stopped and the reaction chamber is purged with a carrier gas such as argon, hydrogen, nitrogen or helium. The resulting portion of tungsten nucleation layer is typically between about 10 to 200 angstroms.

Referring again to FIG. 1, the substrate is next exposed to a boron-containing species to form a boron-containing layer. See process operation 107. The boron-containing layer is often a layer of elemental boron, though in some embodiments, it may contain other chemical species or impurities from the boron-containing species itself or from residual gases in the reaction chamber. Any suitable boron-containing species may be used, including borane ($BH_3$), diborane ($B_2H_6$), triborane, etc. Examples of other boron-containing species include boron halides (e.g., $BF_3$, $BCl_3$) with hydrogen. Unlike the PNL silane deposition operation 103, boron deposition is not a self-limiting adsorption. Rather, the boron-containing species reacts on the substrate surface to decompose into a boron film or layer. The reaction can proceed as long as the substrate is continually exposed to boron-containing species. However, to ensure that a limited amount of tungsten is actually formed in the subsequent step, the diborane deposition is preferably limited to a thickness of between about 3-15 angstroms. This may correspond to about one or two monolayers of boron.

Since the boron-containing layer formation is not of a self-limiting nature, dosage, exposure time and substrate temperatures should be adjusted correspondingly. As with the silane/tungsten-containing precursor pulses in steps 103 and 105, substrate temperature is typically below about 350 C, for example about 250 and 350 C or 275 and 350 C. Frequently, diborane is provided from a diluted source (e.g., 5% diborane and 95% nitrogen). Diborane may be delivered the reaction chamber using other or additional carrier gases such as nitrogen, argon, hydrogen, and/or silane.

Once the boron-containing layer is deposited to a sufficient thickness, the flow of boron-containing species to the reaction chamber is stopped and the reaction chamber is purged with a carrier gas such as argon, hydrogen, nitrogen or helium.

Returning again to FIG. 1, in an operation 109 the boron-containing layer is contacted with a tungsten-containing precursor to form another portion of the tungsten nucleation layer. Reaction conditions are similar to those of the previous tungsten containing precursor exposure operation 105 and the same tungsten-containing precursor is typically used. As with operation 105, the tungsten-containing precursor is typically provided in a dilution gas, such as argon, nitrogen, hydrogen, or a combination thereof. The substrate temperature may be at or below about 350 C, for example between about 250 and 350 C or 275 and 350 C. Tungsten-containing precursor dosage and substrate exposure time will vary depending upon a number factors. In general, the substrate is preferably exposed until the boron-containing layer is sufficiently consumed by reaction with the tungsten-containing precursor.

As described previously, the tungsten nucleation layer should be sufficiently thin so as to not unduly increase the overall tungsten film, but sufficiently thick so as to support a high quality bulk tungsten deposition. It has been demonstrated for purposes of many semiconductor wafer applications that an appropriate thickness of the tungsten nucleation layer is between about 10 and 30 Angstroms, for example between about 20 and 30 Angstroms. If the is tungsten deposited any thinner the wafer may have a "splotchy" appearance from the uneven tungsten distribution.

Once the boron is sufficiently consumed and another portion of the tungsten nucleation layer is formed, the flow of tungsten-containing precursor to the reaction chamber is stopped and the reaction chamber is purged with a carrier gas such as argon, hydrogen, nitrogen or helium.

Referring back to FIG. 1, steps 103-109 are deposited until the tungsten nucleation layer is sufficiently thick in step 111. As described previously, in a number of integrated circuit applications the tungsten nucleation layer is preferably between about 20 and 30 Angstroms. Under typical conditions, implementation of operations 103, 105, 107 and 109 at temperatures below 350 C (one four-step PNL cycle) has been found to deposit a tungsten nucleation layer with about 10-200 angstroms.

Temperature is one of the process conditions that affects the amount of tungsten deposited. Others include pressure, flow rate and exposure time. As discussed above, in many embodiments, maintaining temperatures at or below about 350 C may result in less material deposited during a cycle than in previously described tungsten nucleation layer deposition processes. This in turn may provide lower resistivity. However, in some embodiments, higher temperatures (e.g. at or below 450 C) may be used to deposit the desired amount of tungsten per cycle (typically between 10 and 200 angstroms). In these embodiments, it may be necessary to adjust other process conditions to ensure that the desired amount of tungsten is deposited. For example, in some embodiments, temperatures are maintained at or below 450 C, or at or below 415 C.

Steps 103-109 are typically repeated from 2-20 times. In preferred embodiments, the steps are repeated from 2-5 times (i.e., the four-step PNL cycle is performed from 3-6 times).

Once the tungsten nucleation layer has reached the desired thickness, the tungsten nucleation layer is fully formed and next a bulk tungsten layer is deposited thereon. See step 113. In many embodiments the bulk tungsten is deposited using a CVD process since CVD has been found to rapidly produce low resistivity films. Any suitable CVD process may be used with any suitable tungsten-containing precursor. In some embodiments the same tungsten-containing precursor used in the PNL processes for forming the tungsten nucleation layer is use—typically one of $WF_6$, $WCl_6$ and $W(CO)_6$. Frequently, the CVD process is performed using a mixture of molecular hydrogen and one or more of these precursors. In other embodiments, the CVD process may employ a tungsten precursor together with silane or a mixture of hydrogen and silane or a mixture of hydrogen and borane (such as diborane). Non-CVD process can also be employed to form the bulk layer. These include ALD/PNL and physical vapor deposition (PVD).

The bulk tungsten can be deposited to any thickness. Tungsten interconnect lines for integrated circuit applications may have a total thickness (tungsten nucleation layer and bulk tungsten) of between about 20 and 1,000 Angstroms. For a typical bit line, the total tungsten film thickness is typically no greater than about 500 Angstroms. The resulting tungsten film will preferably have a resistivity of no greater than about 30 $\mu\Omega$-cm (more preferably no greater than about 15 $\mu\Omega$-cm and most preferably not greater than about 10 $\mu\Omega$-cm), depending upon the number and type of PNL cycles used. Resistivity depends on how much of the total thickness is due to the nucleation layer. For example, certain embodiments of the methods of the present invention have been used to deposit a film having a total thickness of around 300 Angstroms and a resistivity of about 16-18 $\mu\Omega$-cm.

After the tungsten film is deposited to a sufficient thickness, the process flow of FIG. 1 is complete. While the process parameters can be varied in order to influence the thickness of the nucleation layer formed at a particular cycle of the process, it has been found that depositing less material per cycle may improve step coverage, adhesion and/or resistivity. For this reason, deposition temperature is often maintained at or less than about 350 C, though as discussed above, higher temperatures may also be used during the PNL deposition steps according to some embodiments. Also, the deposition temperature can be varied from step to step or cycle to cycle as required. Other parameters affecting thickness are the concentration or doses of the various materials delivered to the substrate, and the presence or absence of hydrogen. Processes that employ relatively high concentrations or doses of the reactants are more likely to produce thicker nucleation layers. Note however that all pure component reactants except the boranes are absorbed on the surface of a substrate in a self-limiting fashion. In other words, at a certain point after which no further reactant can be absorbed on the surface, any additional dose or higher concentration will not translate into more tungsten being formed. Therefore, it is within only a relatively narrow window of doses or concentrations that an appreciable difference can be observed. Finally, with respect to the presence or absence of hydrogen, generally it has been found that when hydrogen is used together with the other reactant gases, tungsten nucleation material is deposited more thickly.

It is also worth noting that when hydrogen is used with tungsten hexafluoride, the process of applying tungsten hexafluoride to the substrate surface is not self-limiting. That is, tungsten and hydrogen will continue to react in a manner of a CVD process and the tungsten will continually build to thicker and thicker proportions. Thus, some care should be chosen in determining how much tungsten hexafluoride to deliver to the substrate when it is mixed with hydrogen gas. The same is true of the borane material, regardless of whether or not it is mixed with hydrogen. As indicated, the boranes will continue to react to the surface to build thicker and thicker layers of borane. So to summarize, when a borane is delivered to the substrate and when tungsten hexafluoride together with hydrogen is delivered to the substrate, the quantities of the borane and the tungsten hexafluoride must be carefully controlled to ensure that the amount of deposited material is not too great. Because the nucleation layer is formed via PNL process, each successive component delivered to the reaction chamber is generally delivered free of other reactants used in subsequent steps of a PNL cycle—except as indicated (e.g., silane may be provided with diborane in some embodiments).

Figure 2:
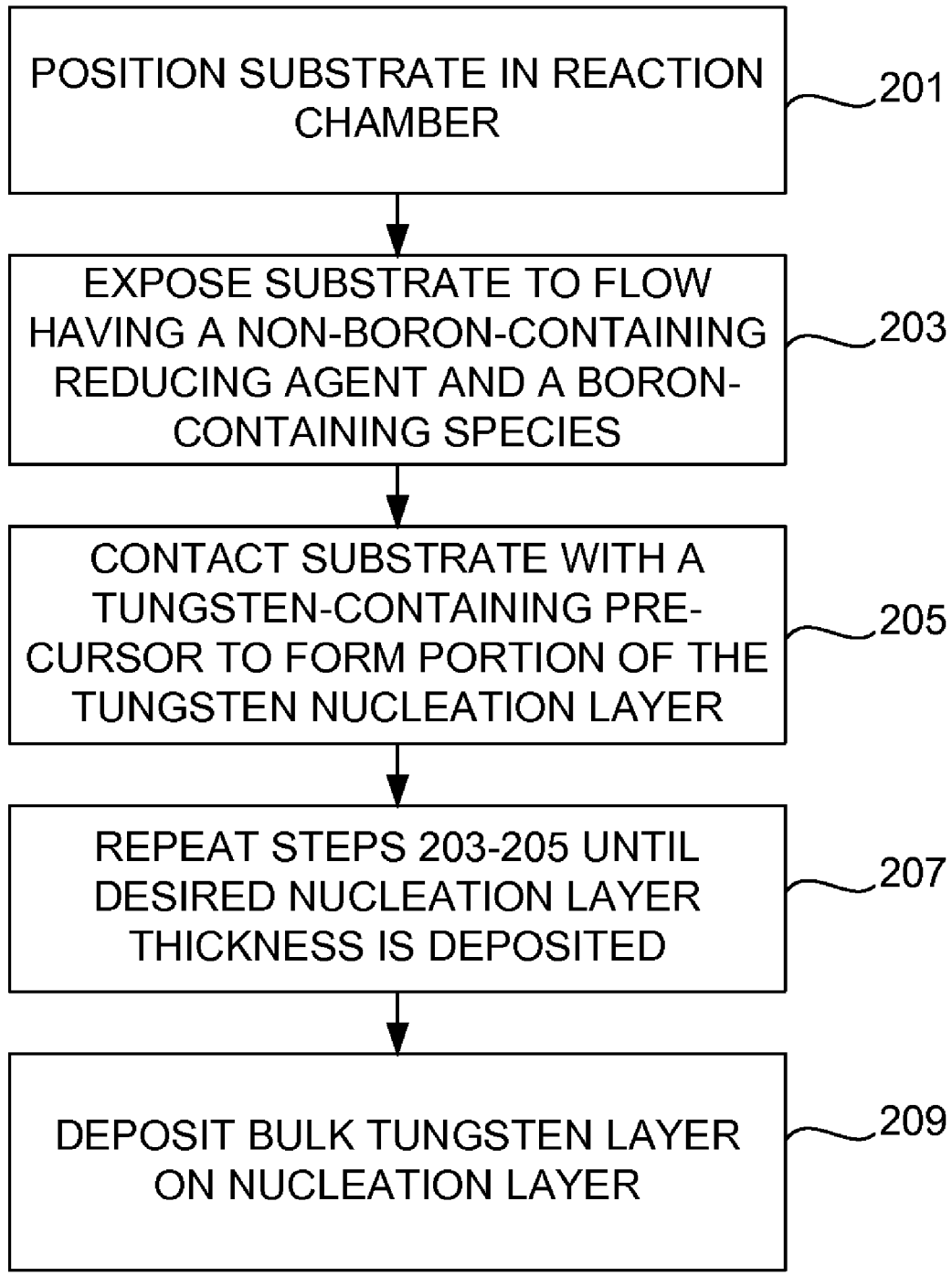

Another preferred method for depositing tungsten nucleation layers is depicted in the flow chart of FIG. 2. As with the process depicted in FIG. 1, initially, a substrate is provided and positioned in a reaction chamber as indicated by a process block 201.

Next, as indicated by a process block 203, the substrate is exposed to a gas flow that includes both a non-boron-containing reducing agent and a boron-containing species. Preferred non-boron reducing agents and boron-containing species are as described above with reference to FIG. 1. In a particularly preferred embodiment, a $SiH_4/B_2F_6$ flow is used.

$SiH_4/B_2F_6$ (or other reactant) flow rate ratios may range from about 0.1 to 5 sscm. Substrate temperatures are typically below 350 C, and may be between about 275 C and 350 C. Substrate temperature, flow rates, and flow rate ratio may change from cycle to cycle. Pressure is as described above in reference to FIG. 1. Exposure time will vary depending in part upon dosages and chamber conditions. The surface is composed of silicon and boron containing species. The boron-containing species will continue to react to the surface to build thicker and thicker boron-containing layers, so as above, it is necessary to carefully control the process to ensure that the amount of deposited material is not too great. In preferred embodiments, from 1-20 monolayers of are deposited. Note that the reducing agent/boron-containing species flow may be provided with or without a carrier gas.

A gas purge then clears the regions near the substrate surface of residual gas reactants that could react with fresh gas reactants for the next reaction step.

Referring back to FIG. 2, the next operation 205 involves contacting the substrate with a tungsten-containing precursor to form a portion of the tungsten nucleation layer. Preferred reactants and process conditions for this step are as described above for the tungsten-containing precursor steps. Notably the temperature is typically below 350 C, for example between 250-350 C, or 275-350 C. The resulting portion of tungsten nucleation layer is typically between about 10-200 angstroms.

As with the process in FIG. 1, in some embodiments, the temperature may be higher for one or all steps, for example at or below than about 450 C and 415 C and will result in the desired amount of tungsten deposited.

Steps 203-205 are then repeated in step 207 until the desired nucleation layer thickness is deposited. Steps 203-205 are typically repeated from 2-20 times. In preferred embodiments, the steps are repeated from 2-5 times (i.e., the two-step PNL cycle is performed from 3-6 times).

Once the tungsten nucleation layer has reached the desired thickness, the tungsten nucleation layer is fully formed and next a bulk tungsten layer is deposited thereon in step 209, typically by a CVD process.

Figure 3:
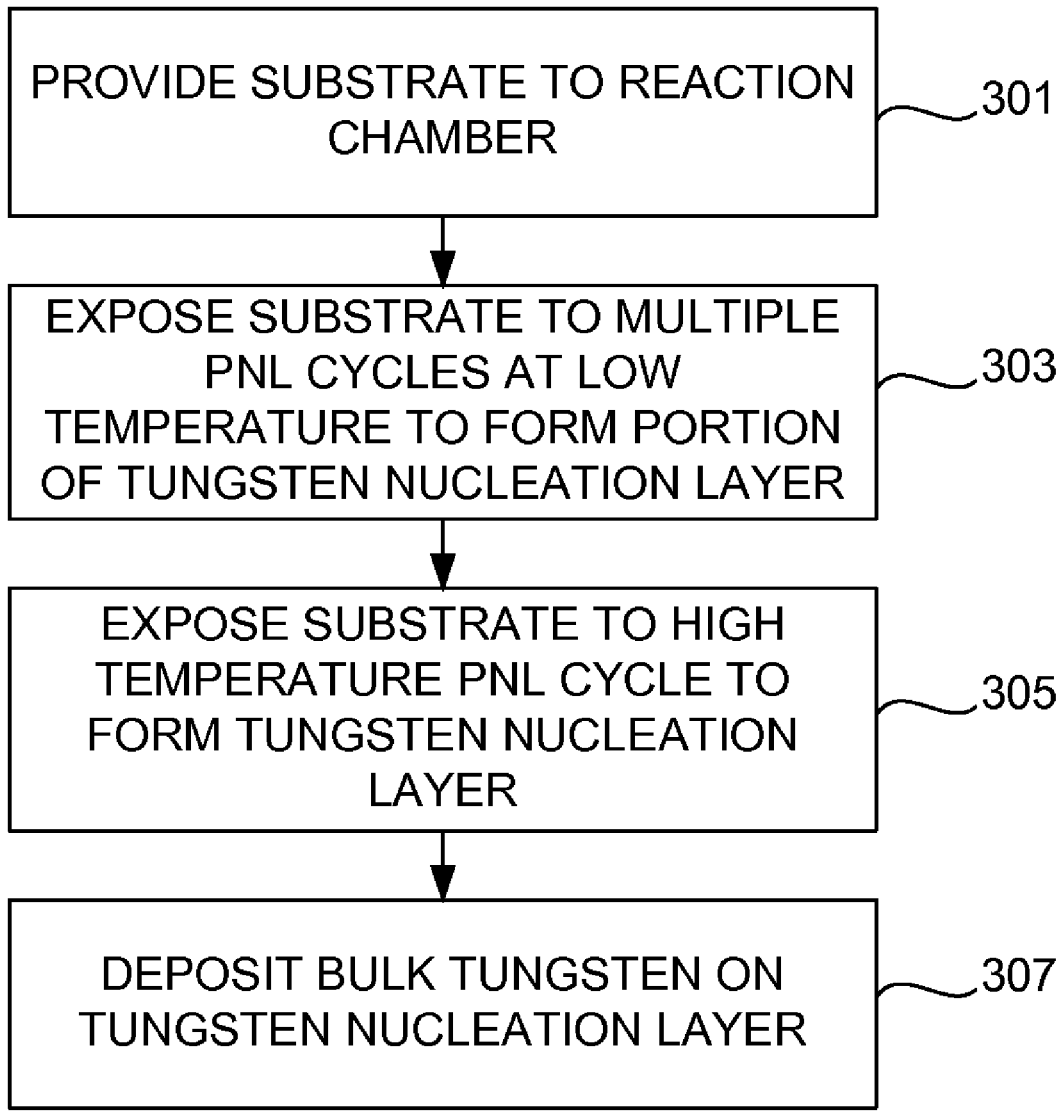

As mentioned above, it some embodiments a low temperature process nucleation deposition process may be followed by a high temperature PNL cycle to lower resistivity of the stack. FIG. 3 is a flow chart depicting steps of this method according to certain embodiments of the invention. A substrate is provided to a reaction chamber in step 301. The substrate is then exposed to low temperature PNL tungsten deposition cycles to deposit most of the tungsten nucleation layer in step 303. The low temperature tungsten deposition cycles involve pulses of a reducing agent (e.g. silane or diborane, or a combination of silane and diborane) followed by pulses of a tungsten-containing precursor. Examples of such processes are given above in FIGS. 1 and 2, though low temperature tungsten nucleation deposition processes are not restricted to the specific sequences described above but may involve any sequence of reducing agent/tungsten-containing precursor pulses. Substrate temperature may be at or below about 350 C, and more preferably between about 275 and 350 C. After most of the tungsten nucleation layer is deposited in step 303, the substrate is exposed to a PNL tungsten deposition at high temperature to form the tungsten nucleation layer in step 305. Substrate temperature in this step is above 350 C, and in certain embodiments above about 375 C, for example between about 375 and 415 C. In preferred embodiments, the reducing agent in step 305 is a boron-containing compound. Also in preferred embodiments, the high temperature process involves a single PNL cycle. Bulk tungsten is then deposited on the nucleation layer at step 307.

Figure 4:
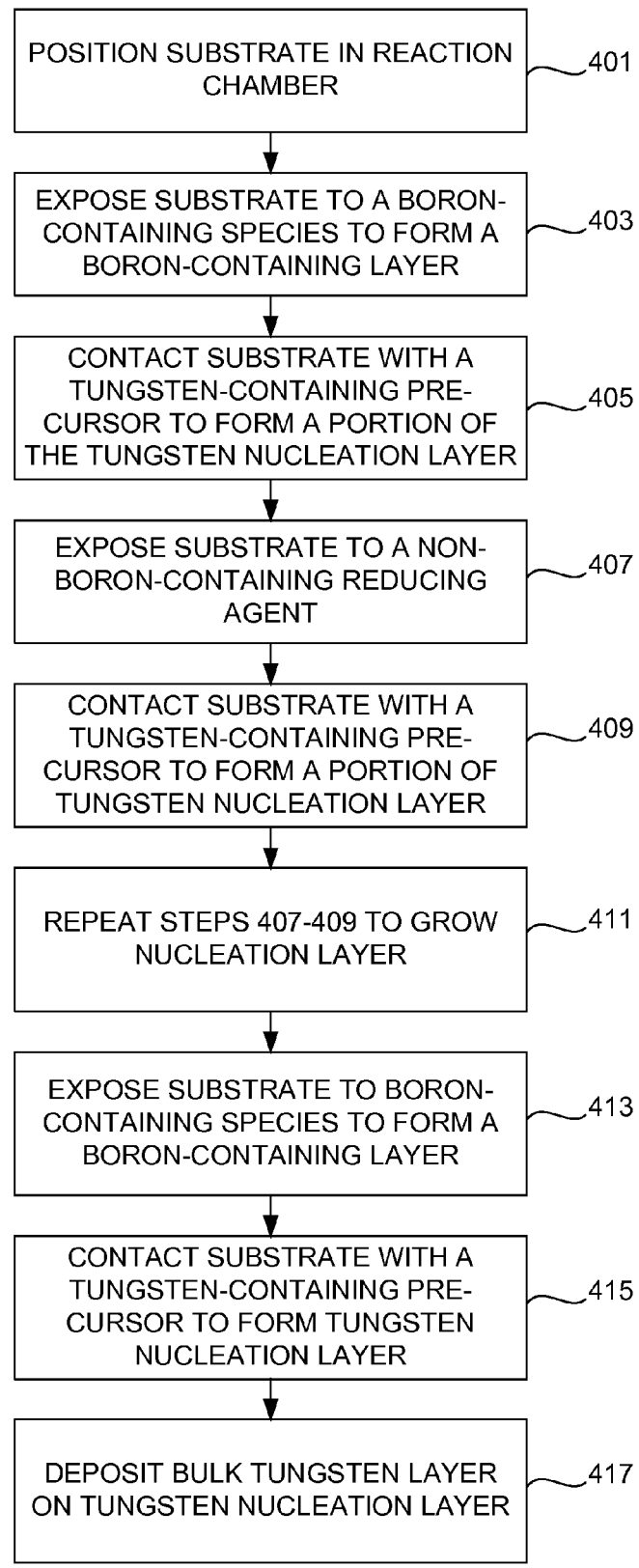

FIG. 4 depicts a specific embodiment of the method depicted in FIG. 3. Initially, a substrate is provided and positioned in a reaction chamber as indicated by a process block 401. The substrate is next exposed to a boron-containing species to form a boron-containing layer at step 403. The layer is then contacted with a tungsten-containing precursor to form a portion of the tungsten-containing layer at step 405. The substrate is then exposed to a non-boron-containing reducing agent, preferably a silane, at step 407 and contacted with a tungsten-containing precursor to form a portion of the tungsten nucleation layer at step 409. Steps 407 and 409 are then repeated to grow the greatest portion of the tungsten nucleation layer at step 411. The substrate temperature is maintained at under about 350 C for steps 403-411, though it may change from cycle to cycle or step to step. Substrate temperature is more preferably between about 275-350 C for these steps.

After most of the tungsten nucleation is formed, the substrate is exposed to a boron-containing species in step 413 to form a boron-containing layer on the substrate. The substrate is then contacted with a tungsten-containing precursor in step 415. Steps 413 and 415 are performed at high temperature, above about 350 C, and in certain embodiments, about 375 C, for example, between about 375 and 415 C. In the embodiment depicted in FIG. 4, step 415 is the last step in the formation of the tungsten nucleation layer. A bulk tungsten layer is then deposited on the nucleation layer at step 417.

In addition to the process sequences described above, the following are process sequences according to embodiments of the invention:

1. One or more pulses of silane and the tungsten-containing precursors followed by one or more pulses of silane, tungsten-containing, boron-containing and tungsten-containing precursors. The process sequence may be written as x(Si/W) (with Si/W indicating a silane pulse followed a tungsten-containing precursor pulse) which is followed by y(Si/W/B/W), or x(Si/W)+y(Si/W/B/W). "x" may be from 1-30 cycles, and in certain embodiments, 1-15 cycles. "y" may be from 1-30 cycles, an in certain embodiments, 1-10 cycles.
2. One pulse of the boron-containing precursor followed by one or more pulses of the silane and the tungsten-containing precursors, followed by one or more pulses of silane, tungsten-containing, boron-containing and tungsten-containing precursors, followed by multiple pulses of the boron-containing and tungsten-containing precursors. The process sequence may be written as (B/W)+x(S/W)+y(S/W/B/W). "x" may be from 1-30 cycles, and in certain embodiments, 1-15 cycles. "y" may be from 1-30 cycles, an in certain embodiments, 1-10 cycles.
3. One or more pulses of silane, tungsten-containing, boron-containing and tungsten-containing precursors, followed by multiple pulses of the boron-containing and boron-containing and tungsten-containing precursors. The process sequence may be written as x(S/W/B/W)+y(B/W). "x" may be from 1-30 cycles, and in certain embodiments, 1-15 cycles. "y" may be from 1-30 cycles, an in certain embodiments, 1-10 cycles.

In variations of all of the above processes, a partial or complete tungsten nucleation layer is treated with a plasma after one of the dose operations, e.g., after dosing with a tungsten precursor. In one example, the plasma is generated from hydrogen, helium, nitrogen, argon, or a mixture of two or more of these components. The purge operation typically follows the plasma treatment. A plasma treatment may help to drive impurity out of the film (e.g., silicon or fluorine) that could reduce resistivity.

In some cases, a purpose of the plasma treatment is to introduce carbon, nitrogen or a specified dopant atom into the tungsten nucleation layer. In such situations, a nitrided or carbided tungsten nucleation layer can result. A nitrided nucleation layer can provide improved barrier properties. Carbon can be provided from various sources including, for example, carbon tetrafluoride and hexafluoroethane. The presence of carbon in the nucleation layer can further reduce resistivity of the tungsten film. In this process, various plasma conditions can be employed. In one example, the plasma is generated from a single radio frequency source (e.g., 13.56 MHz applied to a showerhead or pedestal in the deposition reactor). In another example, a multiple source system is employed; e.g., a 13.56 MHz source provides power to the showerhead and a 450 kHz source provides power to the pedestal, or vice-versa. Typically, the applied frequency range will be between about 450 kHz and 100 MHz.

Apparatus

The methods of the invention may be carried out in various types of deposition apparatus available from various vendors. Examples of suitable apparatus include a Novellus Concept-1 Altus, a Concept 2 Altus, a Concept-2 ALTUS-S, a Concept 3 Altus deposition system, or any of a variety of other commercially available CVD tools. In some cases, the process can be performed on multiple deposition stations sequentially. See, e.g., U.S. Pat. No. 6,143,082, which is incorporated herein by reference for all purposes. In some embodiments, the pulsed nucleation process is performed at a first station that is one of two, five or even more deposition stations positioned within a single deposition chamber. Thus, the reducing gases and the tungsten-containing gases are alternately introduced to the surface of the semiconductor substrate, at the first station, using an individual gas supply system that creates a localized atmosphere at the substrate surface.

In one example, after a first thickness of tungsten deposited, the wafer is moved to a second deposition station and a new wafer is moved into place on the first station. The wafers may be indexed from one deposition station to the next to enable parallel wafer processing after one or more repetitions of the cycle. The full thickness of the tungsten film is achieved by additional cycles with alternating reducing gases and tungsten-containing gases at one or more of the other deposition stations. This is repeated until all substrates are coated to the desired thickness. It is the sum of these individual depositions that forms the total amount of tungsten nucleation layer deposited. Any number of deposition stations, each capable of having a localized atmosphere isolated from adjacent stations, is possible within the single chamber.

The invention also provides for a deposition chamber in which alternating deposition stations are dedicated to deliver either tungsten-containing gases or reducing gases. More specifically, the deposition stations in the chamber are separated into two groups with the first group dedicated to delivery of the reducing gases and the second group for introducing tungsten-containing gas. These stations also can provide for the simultaneous delivery of carrier gases and/or hydrogen with the dedicated gases. Thus, tungsten is deposited by moving wafers from station to station such that the wafer is sequentially exposed to the reducing gases and then the tungsten-containing gases until the desired thickness of tungsten is obtained.

Figure 5A:
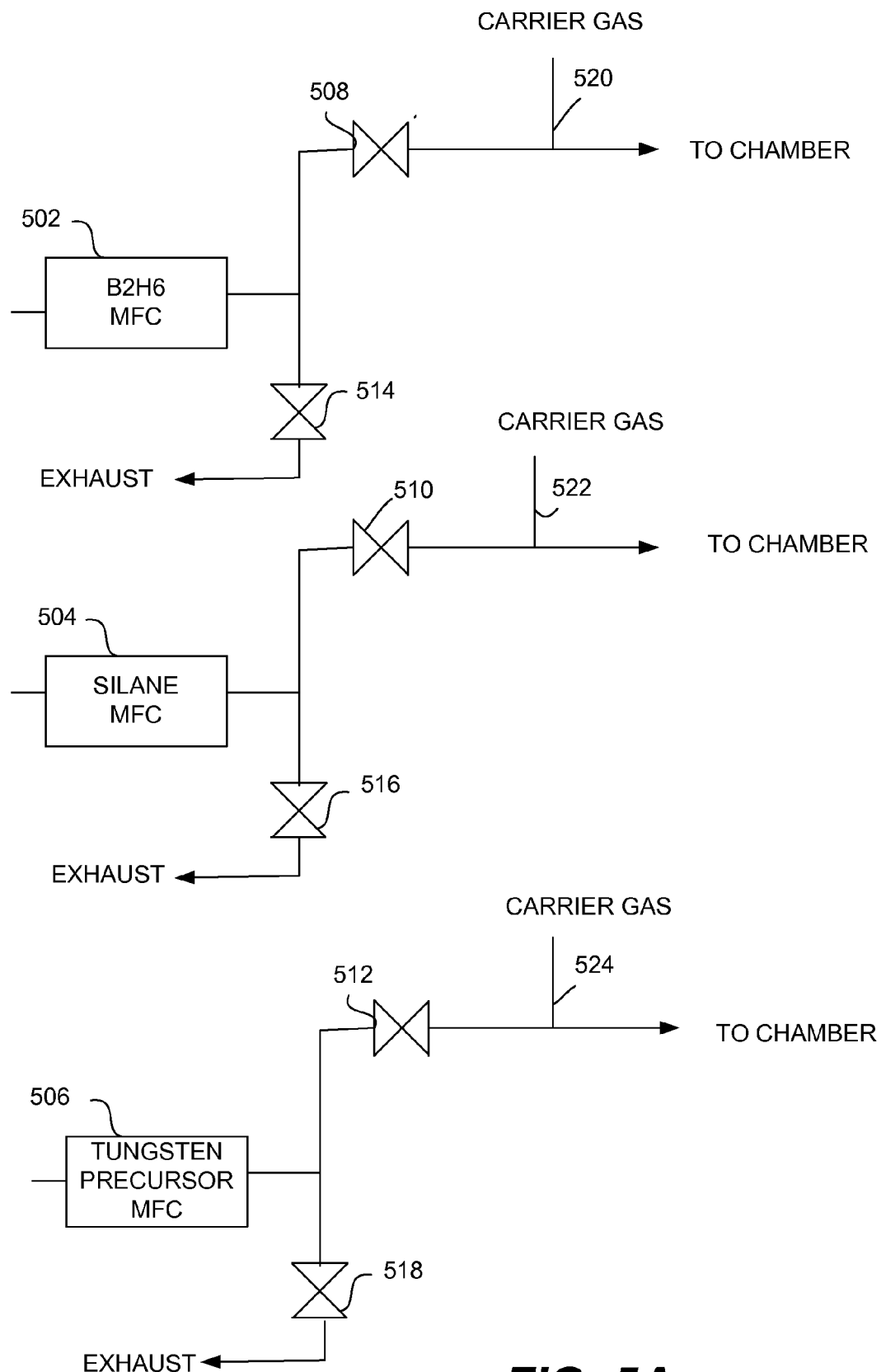
FIG. 5A is a schematic representation of a dual divert gas delivery system that may be used in accordance with the invention.
Figure 5B:
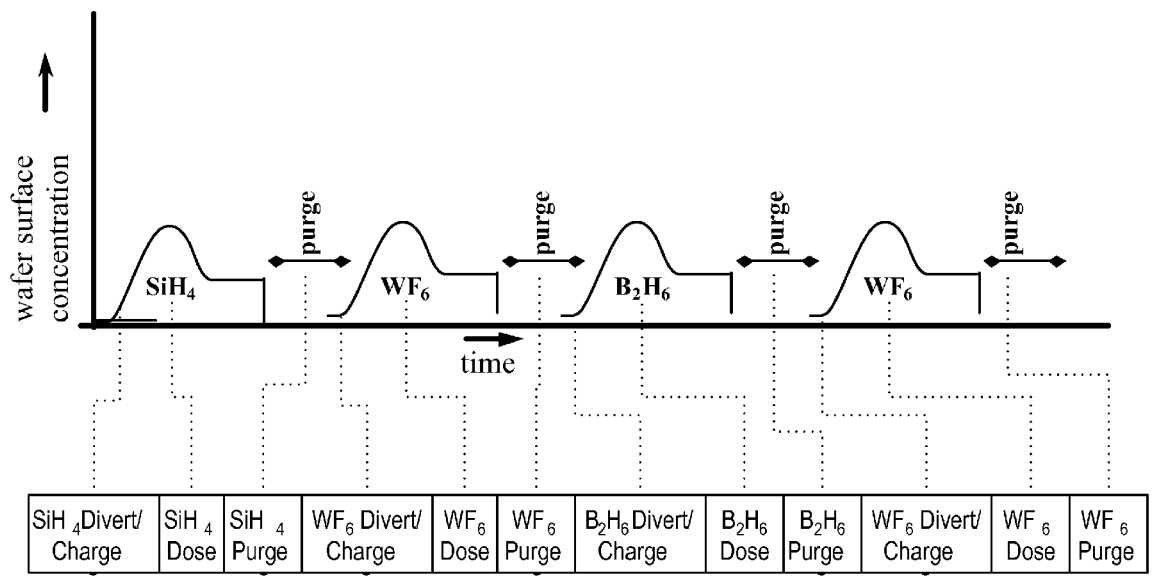
FIG. 5B is a graph representing the reactant gas surface concentration as a function of time using a dual divert gas delivery system.

The flow of reactant and purge gases may be carefully controlled to provide pulses of a desired duration, flow rate, and sequence. FIGS. 5A and 5B depict examples of a suitable apparatus and sequence respectively. As illustrated in FIG. 5A, the exemplary flow control system employs separate sources of diborane, silane, and tungsten precursor, each provided via its own mass flow controller (MFCs 202, 204, and 206, respectively). Two lines come off of the mass flow controller. One is directed to an exhaust (vacuum) and the other is directed to the reaction chamber. Each of these lines has a separate valve attached to it. The valves controlling flow to the reaction chamber are numbered 508, 510, and 512 for the diborane, silane, and tungsten precursor respectively. The valves controlling flow to exhaust are numbered, 514, 516, and 518 for the diborane, silane, and tungsten precursor respectively.

Initially in a preferred process, the flow from the mass flow controller is stabilized by opening the valve to the exhaust and allowing the gas to flow out of the system and thereby create a stable uniform flow pattern. This is sometimes referred to as a "divert" stage because the gas is actually diverted from the chamber to the exhaust. In this stage, the valve on the exhaust line is opened and the valve on the delivery line is closed. The next operation in the process involving this apparatus comprises charging a line to the chamber with the reactant in question. In this operation, the valves to both the chamber and the exhaust are closed in order to pressurize or charge the delivery line. After the line has been sufficiently charged, the valve on the line to the chamber is open and the reactant is swept into the chamber using a carrier gas such as argon or argon together with hydrogen. See carrier gas sources 520, 522, and 524 for the diborane, silane, and tungsten precursor delivery lines respectively. This is referred to as the pulse step of the process. When it is completed, the valve to the chamber is closed while the carrier gas is allowed to continue to flow. This effectively purges the chamber of the reactant.

In an alternative approach, the reactant may be delivered without the aid of a carrier gas. In this arrangement, there is a separate valve for the line providing the carrier gas. It is turned off during the pulse step so that only the reactant and no carrier gas is delivered to the chamber.

FIG. 5B depicts a pulse timeline showing how the various reaction components are delivered to the chamber/substrate in a PNL sequence in accordance with an embodiment of this invention. The vertical axis represents the concentration of the particular reactant gas in the chamber (or adsorbed on the substrate) and the horizontal axis represents time, as divided into stages associated with the various steps of the process.

As shown, the overall nucleation layer deposition process is divided into four basic pulse phases: silane, tungsten precursor, boron precursor, and tungsten precursor. Each of these pulse phases is, in turn, divided into three separate sub-stages (as provided by the apparatus described above): divert/charge, pulse, and purge.

Applications

The present invention may be used to deposit thin, low resistivity tungsten layers for many different applications. One preferred application is for interconnects in integrated circuits such as memory chips and microprocessors. Interconnects are current lines found on a single metallization layer and are generally long thin flat structures. These may be formed by a blanket deposition of a tungsten layer (by a process as described above), followed by a patterning operation that defines the location of current carrying tungsten lines and removal of the tungsten from regions outside the tungsten lines.

A primary example of an interconnect application is a bit line in a memory chip. Of course, the invention is not limited to interconnect applications and extends to vias, contacts and other tungsten structures commonly found in electronic devices. In general, the invention finds application in any environment where thin, low-resistivity tungsten layers are required.

The invention is also focuses on low resistivity, tungsten layers having relatively thin proportions, typically on the order of 500 angstroms or less, preferably, 300 angstroms or less. But more generally, the invention applies to a broader range of tungsten layers, including those with thicknesses of between about 5 angstroms to 1000 angstroms.

Another parameter of interest for many applications is a relatively low roughness of the ultimately deposited tungsten layer. Preferably, the roughness of the tungsten layer is not greater than about 10% of the total thickness of the deposited tungsten layer, and more preferably not greater than about 5% of the total thickness of the deposited tungsten layer. The roughness of a tungsten layer can be measured by various techniques such as atomic force microscopy.

Figure 6A:
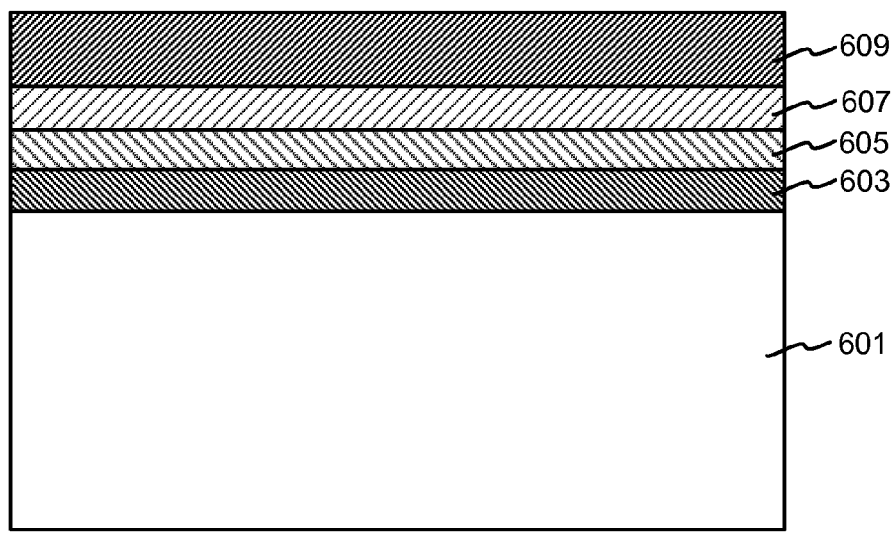
FIG. 6A is a film stack including a titanium adhesion layer together with a tungsten nucleation layer and a tungsten bulk layer formed in accordance with this invention.
Figure 6B:
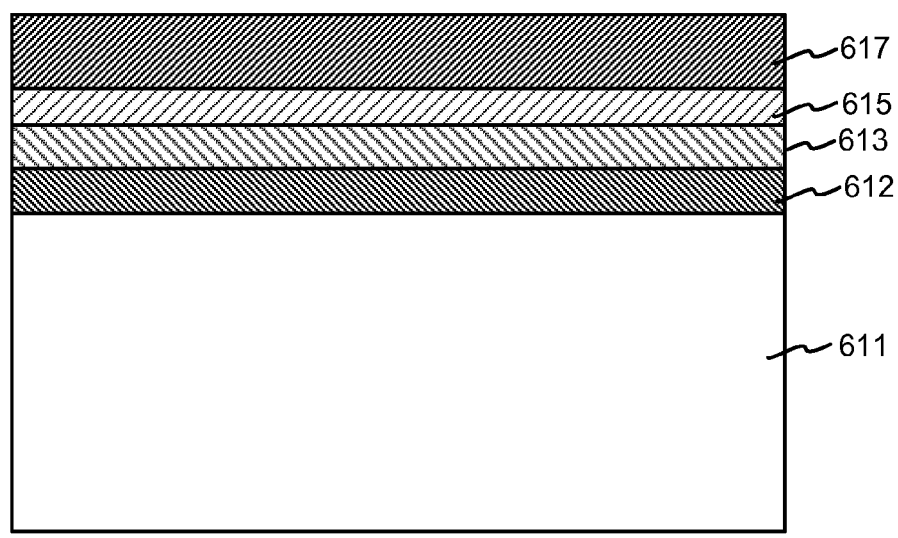
FIG. 6B is a film stack including a tungsten adhesion layer together with a tungsten nucleation layer and a tungsten bulk layer formed in accordance with this invention.

FIGS. 6A and 6B are cross-section illustrations of two different film stacks that can be formed using methods of the invention. Both film stacks may represent interconnect applications as described previously. The film stack of FIG. 6A is formed on an underlining substrate 601, which may be a single component or more commonly a complex multi-feature structure having various conductive, insulating, and semiconductor components. For example, substrate 601 may have a top layer comprising silicon or a dielectric such as silicon dioxide. Contacting substrate 601 is, in the following order, a titanium layer 603, a titanium nitride layer 605, a tungsten nucleation layer 607 (formed in accordance with this invention) and a tungsten bulk layer 609. Titanium layer 603 is typically deposited by a CVD process which provides reasonably good adhesion to the underlying substrate 601. Titanium nitride layer 605 is typically deposited using CVD or PVD methods and is used to protect the underlying titanium and/or silicon from exposure to tungsten hexafluoride ($WF_6$) during subsequent tungsten deposition. It has been found that $WF_6$ reacts very aggressively and sometimes explosively with titanium. Tungsten nucleation layer 607 and tungsten bulk layer 609 are formed in accordance with the methods of the present invention as described above. In interconnect applications as described above, layers 603, 605, 607 and 609 are all etched to form interconnect lines.

The film stack of FIG. 6B is similar to that of FIG. 6A in that there is an underlining substrate 611 (comprising, for example, silicon and/or silicon dioxide), a tungsten nucleation layer 615 and a tungsten bulk layer 617. However, instead of titanium and titanium nitride layers, a tungsten layer 612 and a tungsten nitride layer 613 are employed. The nitride layer 613 is used to protect the underlying silicon from exposure to $WF_6$ and is typically deposited using a CVD or PVD process which provides reasonably good adhesion to the underlying silicon or dielectric substrate, but does not necessarily provide a sufficiently high quality layer to serve as an interconnect. As in the film stack of FIG. 6A, all the layers 612, 613, 615 and 617 are etched to form interconnect lines.

Other Embodiments

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A method of forming a tungsten film on a substrate in a reaction chamber, the method comprising:
    (a) positioning the substrate in a reaction chamber;
    (b) exposing the substrate to a flow comprising a non-boron-containing reducing agent and a boron-containing species to form a boron-containing layer on the substrate;
    (c) after (b), contacting the boron-containing layer with a tungsten-containing precursor to form a portion of a tungsten nucleation layer; and
    (d) depositing a bulk tungsten layer over the tungsten nucleation layer to form the tungsten film.

2. The method of claim 1 further comprising repeating steps (b) and (c) at least one time to form the tungsten nucleation layer.

3. The method of claim 1 wherein steps (b) and (c) are repeated from 2-5 times.

4. The method of claim 1 wherein the substrate temperature ranges from about 200-450 C during steps (b) and (c).

5. The method of claim 4 wherein the substrate temperature ranges from about 275-350 C during step s (b) and (c).

6. The method of claim 1 wherein the non-boron-containing reducing agent is a silane.

7. The method of claim 1 wherein the ratio of the boron-containing species to the non-boron-containing reducing agent ranges from 0.1 to 5.

8. The method of claim 1 further comprising a purge step between each reactive gas introduction.

9. A method of forming a tungsten film on a substrate in a reaction chamber, the method comprising:
 (a) exposing the substrate to a boron-containing species to form a boron-containing layer on the substrate;
 (b) after (a), contacting the boron-containing layer with a tungsten-containing precursor to form a portion of a tungsten nucleation layer;
 (c) after (b), exposing the substrate to a non-boron-containing reducing agent; and
 (d) after (c), exposing substrate to a tungsten-containing precursor to form a portion of the tungsten nucleation layer,
  wherein the substrate temperature at is maintained at or below about 350° C. during operations (a), (b), (c) and (d).

10. The method of claim 9 further comprising repeating operations (c) and (d) at least once, with the substrate temperature maintained at or below about 350° C.

11. The method of claim 9 wherein the substrate temperature is maintained below 350° C. during operations (a), (b), (c) and (d).

12. The method of claim 9 wherein the non-boron-containing reducing agent is a silicon-containing reducing agent.

13. The method of claim 9 further comprising, after forming the tungsten nucleation layer, (e) simultaneously exposing the substrate to a tungsten-containing precursor and a reducing agent to thereby deposit a bulk layer of tungsten on the nucleation layer.

14. The method of claim 13 wherein the reducing agent in (e) is hydrogen.

15. A method of depositing a tungsten layer on a substrate comprising:
 performing a first stage including multiple cycles of a pulsed nucleation layer deposition process, wherein each cycle includes exposing the substrate to alternate pulses of a boron-containing reducing agent and a tungsten-containing precursor at a first substrate temperature of less than 350° C. to thereby deposit a portion of tungsten nucleation layer; and
 after performing the first stage, performing a second stage including exposing the substrate to multiple pulses of the boron-containing reducing agent a second substrate temperature, wherein the second substrate temperature is at least about 25° C. greater than the first substrate temperature.

16. The method of claim 15 further comprising, after performing the second stage simultaneously exposing the substrate to a tungsten-containing precursor and a reducing agent to thereby deposit a bulk layer of tungsten on the nucleation layer.

17. The method of clam 15 wherein the second substrate temperature is at least about 375° C.

18. The method of claim 15 wherein the second substrate temperature is at least about 400° C.

* * * * *